United States Patent
Anand et al.

(10) Patent No.: US 6,956,415 B2
(45) Date of Patent: Oct. 18, 2005

(54) MODULAR DLL ARCHITECTURE FOR GENERATING MULTIPLE TIMINGS

(75) Inventors: Darren L. Anand, Essex Junction, VT (US); Kevin W. Gorman, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,067

(22) Filed: Nov. 19, 2003

(65) Prior Publication Data
US 2005/0104639 A1   May 19, 2005

(51) Int. Cl.$^7$ .............................. H03L 7/00; G06F 1/04
(52) U.S. Cl. ...................................... 327/152; 327/295
(58) Field of Search ................................ 327/149, 152, 327/153, 158, 161, 295, 296, 297; 331/11, 331/12

(56) References Cited

U.S. PATENT DOCUMENTS

| | | | |
|---|---|---|---|
| 0,064,082 A | 4/1867 | Dick | 296/65.05 |
| 5,751,665 A * | 5/1998 | Tanoi | 368/120 |
| 6,147,527 A | 11/2000 | Lee et al. | 327/141 |
| 6,310,822 B1 | 10/2001 | Shen | 365/233 |
| 6,374,360 B1 | 4/2002 | Keeth et al. | 713/400 |
| 6,424,592 B1 | 7/2002 | Maruyama | 365/233 |
| 6,628,155 B2 * | 9/2003 | Park et al. | 327/158 |
| 6,774,689 B1 * | 8/2004 | Sudjian | 327/158 |
| 6,794,912 B2 * | 9/2004 | Hirata et al. | 327/158 |

* cited by examiner

Primary Examiner—Tuan T. Lam
(74) Attorney, Agent, or Firm—Scully, Scott, Murphy & Presser; Robert A. Walsh, Esq.

(57) ABSTRACT

A modular Digital Locked Loop (DLL) architecture capable of generating a plurality of multiple phase clock signals, having particular applicability to synchronization of embedded DRAM systems with on chip timing. The architecture comprises a single core frequency locking circuit that includes a delay element with control logic and locking circuitry capable of locking the DLL system clock frequency to an external reference clock, and a plurality of secondary phase locking circuits capable of synchronizing a plurality of internal clock signals to any phase of the external reference clock.

22 Claims, 3 Drawing Sheets

MODULAR DLL ARCHITECTURE FOR GENERATING MULTIPLE TIMINGS

BACKGROUND OF INVENTION

1. Field of the Invention

The present invention relates generally to any DLL (Digital Locked Loop) architecture requiring the generation of multiple timings (timing signals), and more particularly pertains to a simple modular DLL architecture for an eDRAM (embedded Dynamic Random Access Memory) capable of producing any required number of eDRAM timings.

The present invention is applicable generally to any DLL (Digital Locked Loop) architecture requiring the generation of multiple timings, and is applicable to memory products in general, for example to provide timings for memory array cores and for input and output data, including embedded and non-embedded DRAMs and SRAMs (Static Random Access Memories) and memory controllers.

2. Discussion of the Prior Art

DLL (Digital Locked Loop) architectures are frequently used to produce required timing signals; however, the use of several DLLs to accommodate multiple timing signals is expensive in terms of real estate on the chip.

The embedded DRAM design for one present state of the art ASIC (Application Specific Integrated Circuit) demands a simple architecture capable of producing any required number of embedded DRAM timings.

FIG. 1 illustrates a typical prior art DLL implementation for use in a memory product, and FIG. 2 illustrates timing waveforms illustrative of the operation of the prior art DLL implementation of FIG. 1.

Referring to FIG. 1, a variable delay line 1 is used to delay an edge of an incoming clock signal In by a desired amount. The variable delay line typically comprises either a variable number of fixed delay elements or a fixed number of variable delay elements. Typically a Mimic circuit 2 is used to determine how far ahead of the next clock edge an internal clock needs to transition. This is illustrated in FIG. 2 by the designation Mimic Delay which shows the clock edge of the Result clock transitioning a given time ahead of the clock edge of the Out clock. It is common in synchronous chip designs to require a synchronous circuit output be aligned or lined up with an external clock edge. A mimic circuit provides a fixed time delay which is a mimic of a parasitic circuit delay, and is used to determine when to drive the mimic circuit input so that the mimic circuit output and the synchronous circuit output are properly aligned with the external clock.

The output signal Out from the mimic circuit 2 should be delayed 360° with respect to the main clock signal In, as illustrated in FIG. 2 by the designation Total Delay=1 cycle. The main clock input signal In and the output signal Out from the mimic circuit 2 are compared by a Phase Compare circuit 3, and the Phase compare circuit determines if the delay is too little or too much relative to the desired 360° delay phase shift. The output of the phase compare circuit is directed to a Delay Control circuit 4 which increases or decreases the delay through the Variable Delay Line 1. When the phase of the system is locked, the output signal Result will be the desired Mimic circuit delay before the next clock cycle of In. This can then be used to time output data from a circuit, for example. It should be noted that the standard DLL implementation can only use one Mimic circuit, and only offers a single output timing signal Result.

SUMMARY OF INVENTION

The present invention provides a single DLL architecture capable of generating any number of multiple timing signals.

The present invention provides a modular Digital Locked Loop (DLL) architecture capable of generating a plurality of multiple phase clock signals for synchronization of embedded DRAM systems with on chip timing. The architecture comprises a single core frequency locking circuit that includes a delay element with control logic and locking circuitry capable of locking the DLL system clock frequency to an external clock, and a plurality of secondary phase locking circuits capable of synchronizing a plurality of internal clock signals to any phase of the external clock.

BRIEF DESCRIPTION OF DRAWINGS

The foregoing objects and advantages of the present invention for a modular DLL architecture for generating multiple timings may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

The present invention provides a modular DLL architecture that is capable of producing any number of required timing signals and comprises a single core frequency-locking block and any number of secondary phase-locking blocks.

One exemplary application of the present invention relates to the generation of timing signals on an embedded DRAM, particularly embedded DRAM core array timings wherein a duty cycle of a clock includes an active portion or percentage of the total duty cycle and a restore portion or percentage of the total duty cycle, and the relative phase between the active portion and the restore portion must be precisely controlled.

Figure 3:
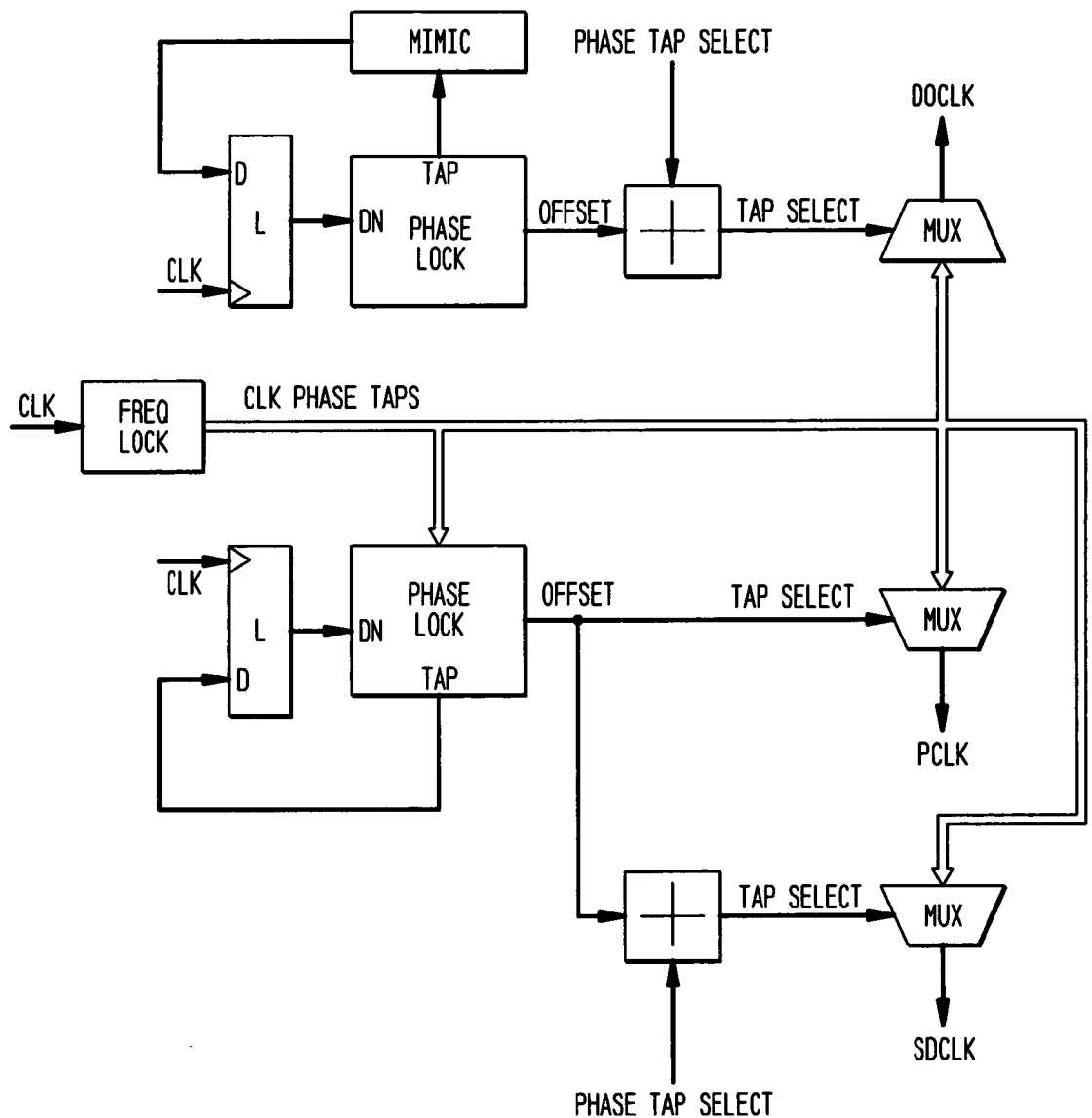
FIG. 3 illustrates an exemplary DLL architecture pursuant to the present invention that is capable of producing any number of required timing signals, and comprises a single core frequency-locking block and any number of secondary phase-locking blocks.

FIG. 3 illustrates an exemplary DLL architecture pursuant to the present invention that is capable of producing any number of required timing signals, and comprises a single core frequency-locking block and any number of secondary phase-locking blocks.

Figure 1:
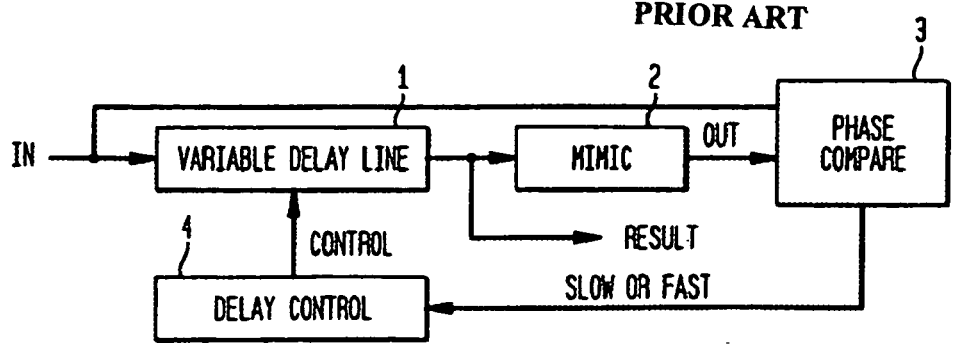
FIG. 1 illustrates a typical prior art DLL implementation for use in a memory product.
Figure 2:
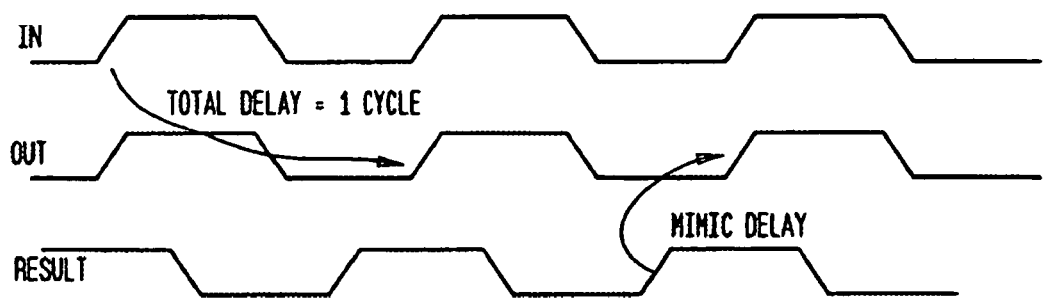
FIG. 2 illustrates timing waveforms illustrative of the operation of the prior art DLL implementation of FIG. 1.

The single core frequency-locking block, designated FREQ Lock in FIG. 3, has a system clock CLK input and an output designated CLK Phase Taps. The single core frequency-locking block can comprise a DLL circuit as shown in FIG. 1 without the mimic circuit, such that the circuit comprises a DLL which includes a delay element, delay element controls, and locking circuitry which locks the DLL to the system clock frequency. The DLL of the core frequency-locking block then continuously updates the frequency lock as environmental conditions change, producing a very closely matched clock throughout the operation.

Traditional DLLs incorporate the mimic circuitry into the main DLL delay element, requiring multiple DLLs to form multiple mimic-path delays, whereas the main frequency-locking core block of the present invention does not incorporate the mimic circuitry therein, and so does not require multiple DLLs to form multiple mimic-path delays.

The frequency-locking core block FREQ Lock is used to produce a number of different clock phases that can be individually phase adjusted for any number of mimic-path delays.

The delay element itself of the frequency-locking core block FREQ Lock is designed to produce an output designated CLK Phase Taps which comprises a series of phase tap points that evenly divide the full 360 degree clock cycle into n degree steps, and in an example of n=64, into 5.625 degree steps, although n can be any desired number. The delay element can comprise a fixed number of variable delay elements, and in one designed embodiment included a fixed number of variable delay elements providing 0 to 63 tap points, each separated by 5.625 degrees.

FIG. 3 illustrates three exemplary secondary phase-locking blocks, an upper secondary phase-locking block with a fixed time delay introduced by a Mimic circuit and producing a secondary output clock DOCLK, and two lower secondary phase-locking blocks without a fixed time delay introduced by a Mimic circuit and producing respective secondary output clocks PCLK and SDCLK, illustrating that the secondary phase-locking blocks can include a mimic circuit or not depending upon the particular application.

Any one of the 0 to 63 tap points can be chosen by each secondary phase locking block for a given clock edge to time a particular DRAM array timing (i.e. active/precharge, signal development, data output clock, etc.).

The most basic secondary phase locking block is shown as the middle secondary phase locking block which produces the clock output PCLK. The secondary phase locking block includes a block entitled Phase Lock which selects a particular one of the 0 to 63 taps and passes it to its output labeled Tap, which is directed to the D port of a latch L. The Phase Lock can comprise a MUX for selecting one of the 0 to 63 inputs and a sequencer and control logic for producing the count and controlling the MUX as described in the operation below. The latch L also receives the same input system clock CLK (as the input to the core frequency locking block) at its clock port shown as >, and uses it along with the clock received at its D port, to produce an output to the DN (down) control of the Phase Lock.

In operation, the secondary phase lock block counts upwardly from 0 toward 63 in single steps. At each step, the system CLK rising edge at port > of the latch L causes the Latch L to sample the D port, and this operation continues until a low to high transition at the rising edge of the clock at the D port of the latch passes a low to high transition at the rising edge of the system CLK. The count is then reduced by 1, and the count then hovers about the count at which the two rising edges are closely coincident. For instance, suppose that the count starts at 0 and proceeds upwardly in increments of 1, and for each of counts 0 to 40, a sampling of the D port produced a low, and then at the count of 41, a sampling of the D port produced a high. The count would be reduced to 40, and the count would hover at 40 at the coincidence of the two rising edges. That count of 40 is a digital output of the Phase Lock labeled Offset which is the Tap Select input to a MUX (multiplexer) which selects and passes the 40 clock of the possible 0 to 63 clocks as the output at PCLK.

The lower secondary phase locking circuit producing the clock SDCLK inserts, into the basic design explained above, an adder labeled + between the output Offset and the input Tap Select which simply adds a phase increment or offset of the system clock CLK to the clock output SDCLK. For instance, continuing the above example where Offset is 40, a Phase Select Tap Input of a digital 10 would produce a Tap Select of 50, to cause the MUX to select and pass the 50 clock of the possible 0 to 63 clocks as the output at SDCLK.

The upper secondary phase locking circuit producing the clock DOCLK inserts a fixed time delay introduced by the Mimic circuit into the Phase Lock. The difference between the fixed time delay introduced by the Mimic circuit and the delay introduced by the adder labeled + is that the time delay introduced by the Mimic circuit is a fixed time delay, whereas the delay introduced by the adder labeled + is a relative time delay which is a phase increment or offset of the system clock CLK.

Any number of timing phases can be easily generated by either adding secondary phase locking circuits (if some mimic-path delays need to be changed), or by simply adding phase tap multiplexers, or multiplexers and adders, for generating multiple clocks from a single mimic-path delay if that delay is common.

Figure 4:
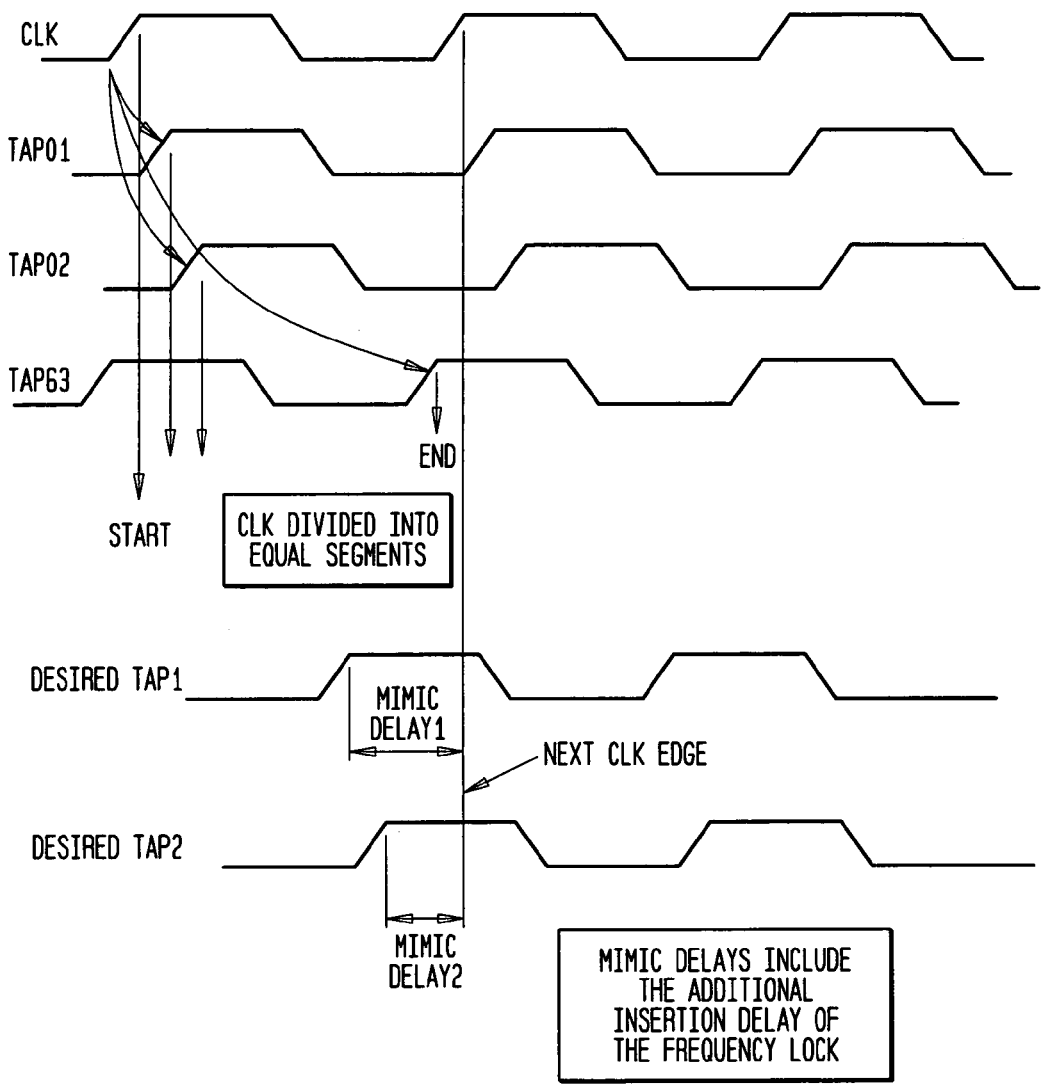
FIG. 4 illustrates modular DLL architecture timing signals representative of the operation of the present invention.

FIG. 4 illustrates modular DLL architecture timing signals representative of operation of the present invention. Referring to FIG. 4, note that the cycle is divided into 64 equal segments. Each "Tap" from the DLL delay line can be used as a potential phase for an internal clock timing. In FIG. 4, two exemplary outputs are shown, Desired Tap1 and Desired Tap2. These two clocks will always transition high at Mimic Delay1 and Mimic Delay2, respectively, before the external clock.

In general, three key pieces of timing information are taken into account for each final DLL output.

The first key piece of timing information is the insertion delay of the frequency lock. Since the frequency lock is phase shifted, the first tap from the delay line is not aligned with the external clock. Therefore, to get an output that is in a known position relative to the external clock, the insertion delay of the frequency lock must be compensated. This is done in the core phase lock circuitry in FIG. 3.

The second key piece of timing information is the mimic circuit delay which is optional. It is very common in synchronous chip designs to require a circuit output be lined up with an external clock edge. The DLL can use a mimic of that circuit delay to determine when to drive it's input so the output is lined up with the external clock.

The third key piece of timing information is the control input to the DLL to provide the ability to reference each secondary phase lock block to any phase position of the external clock. In FIG. 1, the prior art DLL system can only reference the mimic output to the rise of the external clock. The Modular DLL Architecture of the present invention allows referencing each secondary phase lock block, including a mimic output, to any phase of the external clock. This is accomplished using the Phase Tap Selects from FIG. 3. An adder circuit + combines the desired tap point result (offset) from the phase lock circuitry with the Phase Tap Select input which represents the desired phase position as an external clock reference. This allows the Modular DLL Architecture to, for example, generate an internal data out clock that will cause external data transitions to occur at the external clock rise plus 90 degrees (change data ¼ into the cycle). If the Phase Tap Selects are all zero, the DLL will use the external clock rise as the reference to "back up" from.

The present invention provides a simple, modular architecture wherein multiple timings are generated with a single DLL circuit. The unique design incorporates a single core frequency-locking block in conjunction with multiple phase lock/tap select units. Any number of phase lock circuits can be combined with mimic circuits to remove a variety of clock delays and produce a resultant series of delay adjusted clock phases.

The present invention provides a DLL architecture that provides for multiple output clock timings from a single synchronized system. The DLL architecture provides for multiple timings and comprises a single core frequency-locking block and any number of secondary phase-locking blocks. The core frequency-locking block includes a delay element, delay element controls, and locking circuitry to lock the DLL to the system clock frequency. The DLL architecture allows synchronization of clocks to any phase of the external clock.

While several embodiments and variations of the present invention are described in detail herein, it should be apparent that the disclosure and teachings of the present invention will suggest many alternative designs to those skilled in the art.

What is claimed is:

1. A modular Digital Locked Loop (DLL) architecture for generating a plurality of multiple phase clock signals comprising:
   a single core frequency lock circuit comprising a delay element, a phase compare circuit, and a delay control circuit, for locking the single core frequency lock circuit to an external reference clock wherein the single core frequency lock circuit generates a plurality of internal clocks from, and in phase with, the external reference clock;
   a plurality of secondary phase lock circuits, each receiving an output from the single core frequency lock circuit, for generating a plurality of internal clock signals wherein each of the plurality of secondary phase lock circuits has inputs of the plurality of internal clocks and the external reference clock signal, and each secondary phase lock circuit produces a clock select digital code for selecting a particular one of the generated plurality of internal clocks.

2. The DLL architecture of claim 1, wherein the architecture is used for synchronization of an embedded DRAM system on a chip with on chip timing.

3. The DLL architecture of claim 1, wherein the single core frequency lock circuit generates the plurality of internal clocks having the same frequency as the external reference clock and which are phase displaced relative to each other.

4. The DLL architecture of claim 3, wherein the plurality of internal clocks have a phase shift incrementally spaced by 360°/n where n is the number of the plurality of internal clocks.

5. The DLL architecture of claim 1, wherein the clock select digital code is as input to a steering logic circuit signal for providing the selected particular one of the generated plurality of internal clocks.

6. The DLL architecture of claim 1, wherein each secondary phase lock circuit includes a phase lock which selects a particular one of the generated plurality of internal clocks and passes it as a first input to a first port of a latch, the latch also receives the external reference clock as a second input at a clock port of the latch, and uses the first and second inputs to produce an input to control the phase lock.

7. The DLL architecture of claim 6, wherein each secondary phase lock circuit counts in incremental steps, and at each step, a rising edge of the external reference clock at the clock port of the latch causes the latch to sample the first port, and this operation continues until a rising edge of the clock at the first port of the latch passes the rising edge of the external reference clock, and the count then hovers about a count at which the two rising edges are closely coincident.

8. The DLL architecture of claim 7, wherein when the rising edge of the clock at the first port of the latch passes the rising edge of the external reference clock, the count is incrementally reduced, and the count then hovers about the count at which the two rising edges are closely coincident.

9. The DLL architecture of claim 7, wherein the count controls a multiplexer to select and pass one of the plurality of generated internal clocks as an output of the secondary phase lock circuit.

10. The DLL architecture of claim 7, wherein, in at least one secondary phase lock loop, the count is passed as a digital output to an adder which adds to the count a digital value representative of a phase increment or offset of the external reference clock.

11. The DLL architecture of claim 7, wherein at least one secondary phase lock loop includes a mimic circuit which inserts a fixed time delay, introduced by the mimic circuit, into the phase lock loop.

12. A method of generating a plurality of multiple phase clock signals in a modular Digital Locked Loop (DLL) architecture, comprising:
   locking a single core frequency lock circuit, comprising a delay element, a phase compare circuit and a delay control circuit, to an external reference clock which generates a plurality of internal clocks from, and in phase with the external reference clock by the single core frequency lock circuit;
   generating a plurality of internal clock signals by a plurality of secondary phase lock circuits, each receiving an output from the single core frequency lock circuit which produces a clock select digital code for selecting a particular one of the generated plurality of internal clocks by each of the plurality of secondary phase lock circuits, each having inputs of the plurality of internal clocks and the external reference clock signal.

13. The method of claim 12, wherein the plurality of multiple phase clock signals are used for synchronizing an embedded DRAM system on a chip with on chip timing.

14. The method of claim 12, including generating the plurality of internal clocks having the same frequency as the external reference clock and which are phase displaced relative to each other by the single core frequency lock circuit.

15. The method of claim 14, including generating the plurality of internal clocks with a phase shift incrementally spaced by 360°/n where n is the number of the plurality of internal clocks.

16. The method of claim 12, including each of the secondary phase lock circuits inputting the clock select digital code to a steering logic circuit signal for providing the selected particular one of the generated plurality of internal clocks.

17. The method of claim 12, including each of the secondary phase lock circuits selecting a particular one of the generated plurality of internal clocks and passing it as a first input to a first port of a latch by a phase lock, the latch also receiving the external reference clock as a second input at a clock port of the latch, and using the first and second inputs to produce an input to control the phase lock.

18. The method of claim 17, including each of the secondary phase lock circuits counting in incremental steps, and at each step, a rising edge of the external reference clock at the clock port of the latch causing the latch to sample the first port, and continuing this operation until a rising edge of the clock at the first port of the latch passes a rising edge of the external reference clock, and then hovering the count about a count at which the two rising edges are closely coincident.

19. The method of claim 18, wherein when the rising edge of the clock at the first port of the latch passes the rising edge of the external reference clock, incrementally reducing the count and hovering the count about a count at which the two rising edges are closely coincident.

20. The method of claim 18, including the controlling a multiplexer with the count to select and pass one of the plurality of generated internal clocks as an output of the secondary phase lock circuit.

21. The method of claim 18, further comprising, in at least one secondary phase lock loop, passing the count as a digital output to an adder which adds to the count a digital value representative of a phase increment or offset of the external reference clock.

22. The method of claim 18, further comprising, in at least one secondary phase lock loop, including a mimic circuit which inserts a fixed time delay, introduced by the mimic circuit, into the phase lock loop.

* * * * *